United States Patent
Daley et al.

(10) Patent No.: US 7,811,919 B2
(45) Date of Patent: Oct. 12, 2010

(54) METHODS OF FABRICATING A BEOL WIRING STRUCTURE CONTAINING AN ON-CHIP INDUCTOR AND AN ON-CHIP CAPACITOR

(75) Inventors: Douglas M. Daley, Essex Junction, VT (US); Mete Erturk, Alburg, VT (US); Edward J. Gordon, Bristol, VT (US)

(73) Assignee: International Business Machines Corporation, Armonk, NY (US)

( * ) Notice: Subject to any disclaimer, the term of this patent is extended or adjusted under 35 U.S.C. 154(b) by 182 days.

(21) Appl. No.: 12/146,546

(22) Filed: Jun. 26, 2008

(65) Prior Publication Data

US 2009/0322446 A1    Dec. 31, 2009

(51) Int. Cl.
*H01L 21/44* (2006.01)

(52) U.S. Cl. ............... 438/597; 438/618; 438/680; 438/692; 257/E21.006; 257/E21.17; 257/E21.32; 257/E21.218; 257/E21.253; 257/E21.267; 257/E21.304; 257/E21.499; 257/E21.645

(58) Field of Classification Search ............... 438/238, 438/311.598, 597, 617, 680, 692, 683, 685, 438/687, 712, 752, 753, 769, 933; 257/E21.17, 257/32, 6, 218, 253, 267, 304, 499, 645
See application file for complete search history.

(56) References Cited

U.S. PATENT DOCUMENTS

| 5,208,725 | A |  | 5/1993 | Akcasu |
| 5,446,311 | A |  | 8/1995 | Ewen et al. |
| 6,335,210 | B1 | * | 1/2002 | Farooq et al. ............ 438/15 |
| 6,762,088 | B2 |  | 7/2004 | Acosta et al. |
| 6,937,456 | B2 |  | 8/2005 | Pasternak |
| 7,005,319 | B1 | * | 2/2006 | Chen et al. ............ 438/107 |
| 7,473,979 | B2 | * | 1/2009 | Clevenger et al. ...... 257/532 |
| 7,531,407 | B2 | * | 5/2009 | Clevenger et al. ...... 438/238 |
| 2007/0123015 | A1 |  | 5/2007 | Chinthakindi et al. |
| 2007/0279835 | A1 |  | 12/2007 | Chinthakindi |
| 2009/0322447 | A1 | * | 12/2009 | Daley et al. ............ 333/185 |

\* cited by examiner

*Primary Examiner*—David Nhu
(74) *Attorney, Agent, or Firm*—Wood, Herron & Evans, LLP

(57) ABSTRACT

Methods for fabricating a back-end-of-line (BEOL) wiring structure that includes an on-chip inductor and an on-chip capacitor, as well as methods for tuning and fabricating a resonator that includes the on-chip inductor and on-chip capacitor. The fabrication methods generally include forming the on-chip capacitor and on-chip inductor in different metallization levels of the BEOL wiring structure and laterally positioned to be substantially vertical alignment. The on-chip capacitor may serve as a Faraday shield for the on-chip inductor. Optionally, a Faraday shield may be fabricated either between the on-chip capacitor and the on-chip inductor, or between the on-chip capacitor and the substrate. The BEOL wiring structure may include at least one floating electrode capable of being selectively coupled with the directly-connected electrodes of the on-chip capacitor for tuning, during circuit operation, a resonance frequency of an LC resonator that further includes the on-chip inductor.

25 Claims, 9 Drawing Sheets

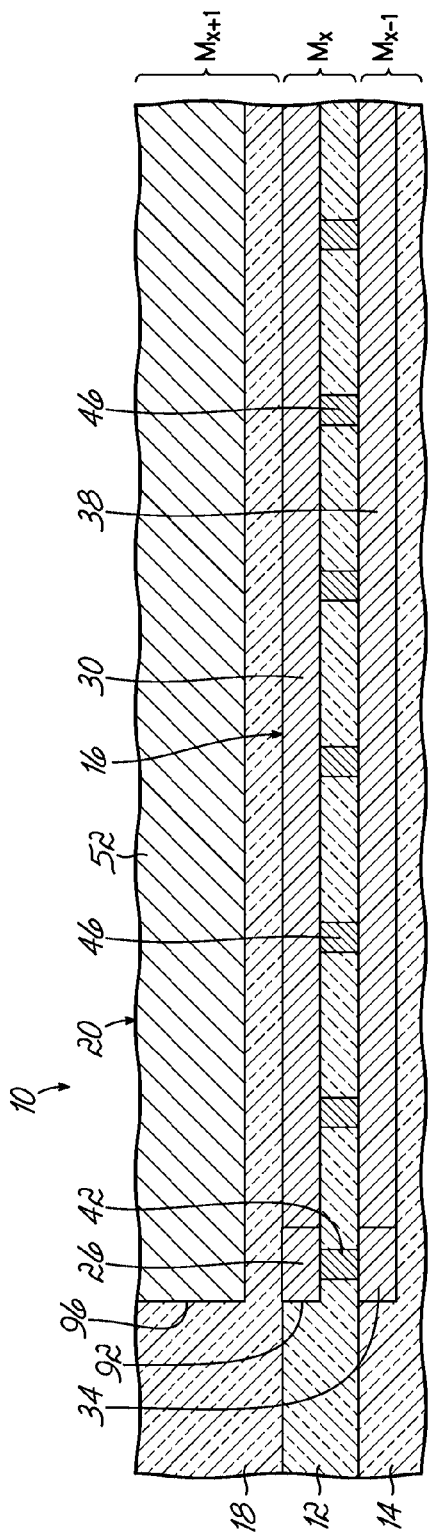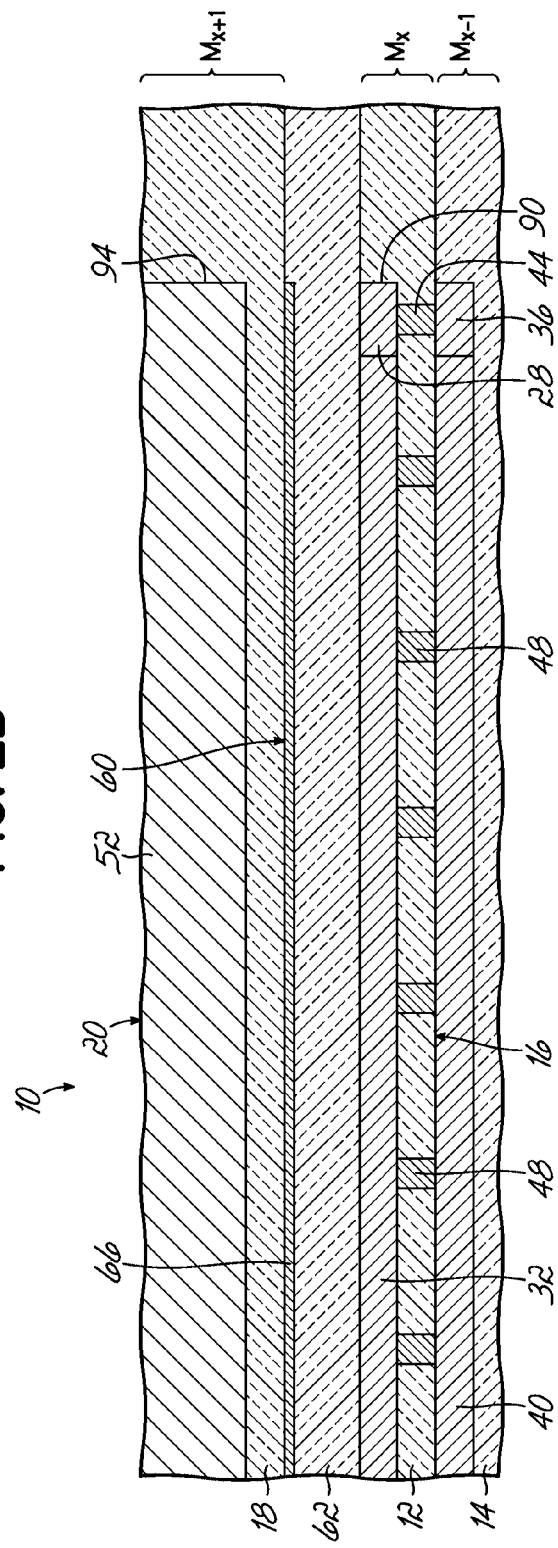

METHODS OF FABRICATING A BEOL WIRING STRUCTURE CONTAINING AN ON-CHIP INDUCTOR AND AN ON-CHIP CAPACITOR

CROSS-REFERENCE TO RELATED APPLICATIONS

This application is related to application Ser. No. 12/146,555, on even date herewith and entitled "BEOL WIRING STRUCTURES THAT INCLUDE AN ON-CHIP INDUCTOR AND AN ON-CHIP CAPACITOR, AND DESIGN STRUCTURES FOR A RADIOFREQUENCY INTEGRATED CIRCUIT", which is hereby incorporated by reference herein in its entirety.

FIELD OF THE INVENTION

The invention relates generally to semiconductor device fabrication and, in particular, to methods for fabricating back-end-of-line wiring structures that include an on-chip inductor and an on-chip capacitor, as well as methods for tuning a resonator that includes the on-chip inductor and on-chip capacitor.

BACKGROUND OF THE INVENTION

Capacitors and inductors represent two types of on-chip passive devices commonly employed in many types of monolithic integrated circuits designed to operate at high frequencies, such as those found in wireless communication devices. In particular, on-chip passive devices are found in radiofrequency integrated circuits (RFICs), which have applications such as Phase-Locked Loop (PLL) transmitters, voltage controlled oscillators (VCOs), impedance matching networks, filters, etc. The integration of on-chip capacitors and inductors is accomplished by introducing these passive devices into one or more of the metallization levels of the back-end-of-line (BEOL) wiring structure, which are used to electrically connect the active devices fabricated using the semiconductor substrate during front-end-of-line (FEOL) processing. A popular method of forming a BEOL wiring structure is a dual damascene process in which vias and trenches in various dielectric layers are filled with metal in the same process step to create multi-level, high density metal interconnections.

Relevant parameters characterizing on-chip inductors include inductance and the quality factor Q. The quality factor Q, which is a commonly accepted indicator of inductor performance in an RFIC, represents a measure of the relationship between energy loss and energy storage. Parasitic capacitance and parasitic resistance from eddy current losses are generated between the conductors forming the on-chip inductor and the semiconductor substrate. A high value for the quality factor, Q, reflects low energy losses to the substrate. To that end, conventional BEOL wiring structures may rely on a Faraday shield at the first metal (M1) level to optimize substrate isolation of on-chip inductors.

Despite their usefulness, on-chip passive devices tend to make rather inefficient use of the surface area in the BEOL wiring structure. In particular, completely separate areas are used for each on-chip inductor and each on-chip capacitor. As a result, the area available in the BEOL wiring structure for the conductive paths actually used to connect the active devices is reduced.

Improved fabrication techniques are needed for forming compact BEOL wiring structures that overcome problems associated with the conventional inefficiencies in the use of chip area and other deficiencies of conventional techniques for fabricating conventional BEOL wiring structures that include an on-chip capacitor and an on-chip inductor.

SUMMARY OF THE INVENTION

In an embodiment of the invention, a method is provided for fabricating a back-end-of-line (BEOL) wiring structure on a substrate carrying an integrated circuit. The BEOL wiring structure includes at least one first metallization level and at least one second metallization level vertically between the at least one first metallization level and the substrate. The method includes forming a plurality of first conductive features in the at least one first metallization level that define an on-chip inductor. The method further includes forming a plurality of second conductive features in the at least one second metallization level that define an on-chip capacitor, which is positioned laterally in the at least one second metallization level such that the on-chip capacitor is in substantially vertical alignment with the on-chip inductor in the at least one first metallization level.

The vertically stacked arrangement or layout for the on-chip capacitor and the on-chip inductor in the BEOL wiring structure conserves the chip area required for these passive devices by providing a compact form factor. As a result, more area is available in the BEOL wiring structure for connections with the active devices carried on the chip. Because of the vertically stacked layout, the on-chip capacitor may also function as a Faraday shield so that a discrete Faraday shield may be omitted from the BEOL wiring structure.

In another embodiment of the invention, a method is provided for fabricating an LC resonator with a resonance frequency that is tunable during operation. The method includes forming a plurality of signal lines of an on-chip inductor in at least one first metallization level of the BEOL wiring structure, forming a plurality of electrodes for an on-chip capacitor in at least one second metallization level of the BEOL wiring structure, and forming a plurality of conductive features in the at least one first metallization level and the at least one second metallization level that connect the signal lines of the on-chip inductor with the electrodes of the on-chip capacitor to define the LC resonator. In addition, at least one floating electrode is formed in the at least one second metallization level that is electrically insulated from the electrodes of the on-chip capacitor. The method further includes forming a switching device configured to connect the at least one floating electrode indirectly with the electrodes of the on-chip capacitor to permit tuning of the resonance frequency of the LC resonator during operation of the LC resonator.

In yet another embodiment of the invention, a method is provided for tuning a resonance frequency of an LC resonator that includes a plurality of signal lines for an on-chip inductor and a plurality of electrodes for an on-chip capacitor in different metallization levels of a BEOL wiring structure. The method includes, while the LC resonator is operating and the chip is powered, selectively coupling at least one floating electrode in at least one of the different metallization levels with the electrodes of the on-chip capacitor to tune the resonance frequency of the LC resonator by changing a capacitance of the on-chip capacitor.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 2B is a cross-sectional view similar to FIG. 2A in which the other port of the on-chip capacitor is visible.

FIG. 3A is a cross-sectional view of the BEOL wiring structure of FIG. 3 in which one port of the on-chip capacitor and the dielectric layers for the different metallization levels are visible.

DETAILED DESCRIPTION

Figure 1:
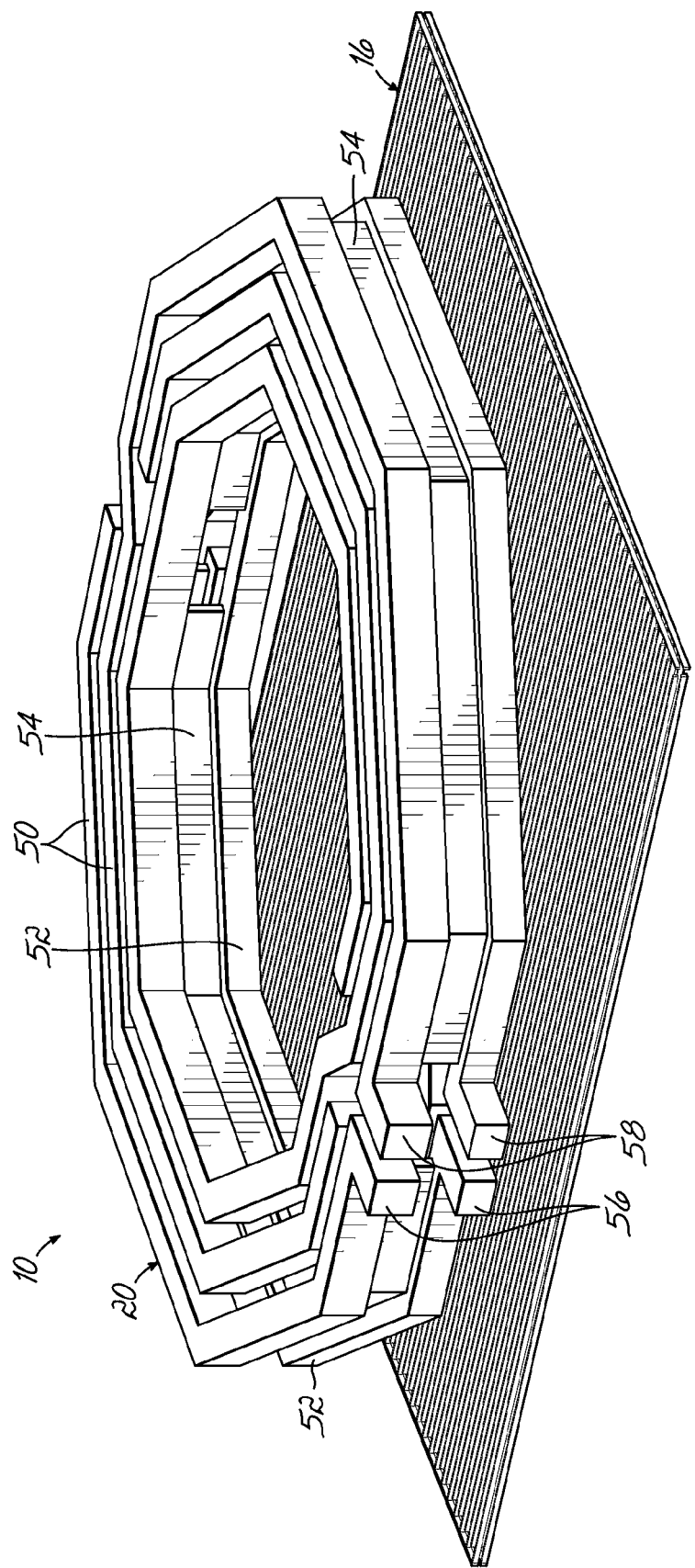
FIG. 1 is a perspective view of a portion of a BEOL wiring structure that integrates an on-chip inductor and an on-chip capacitor constructed in accordance with an embodiment of the invention and in which the capacitor is arranged between the inductor and the substrate with dielectric layers for the metallization levels omitted for clarity of illustration.

With reference to FIGS. 1, 2, 2A, 2B and in accordance with an embodiment of the invention, a back-end-of-line (BEOL) wiring structure, generally indicated by reference numeral 10, includes a dielectric layer 12 of a metallization level ($M_x$), a dielectric layer 14 of a metallization level ($M_{x-1}$) underlying the metallization level ($M_x$), an on-chip capacitor 16 embedded in the dielectric layers 12, 14, a dielectric layer 18 of an upper metallization level ($M_{x+1}$) overlying the metallization level ($M_x$), a dielectric layer 19 of an upper metallization level ($M_{x+2}$) overlying the metallization level ($M_{x-a}$), and an on-chip inductor 20 embedded in the dielectric layers 18, 19. Additional metallization levels (not shown) may exist below the metallization level ($M_{x-1}$), between metallization level ($M_x$) and metallization levels ($M_{x+1}$, $M_{x+2}$), and/or above the upper metallization levels ($M_{x+1}$, $M_{x+2}$). Conductive features in the different metallization levels of the BEOL wiring structure, such as the representative features 13, 15, 17 visible in FIG. 2A, interconnect devices of an integrated circuit and may provide circuit-to-circuit connections, or may establish contacts with input and output terminals. Typically, features in upper metallization levels of the BEOL wiring structure 10 are thicker and wider, and have a greater pitch, than features found in lower metallization levels.

The on-chip capacitor 16 and on-chip inductor 20 of the BEOL wiring structure 10 represent passive devices associated with an integrated circuit, such as a radiofrequency integrated circuit (RFIC), which also includes active devices, such as the representative active devices 22a, 22b, fabricated by front-end-of-line (FEOL) processes on a substrate 24. The active devices 22a, 22b are illustrated as field effect transistors, although the invention is not so limited, having gate stacks 21a, 21b on a top surface 23 of the substrate 24 and source/drain diffusions in the semiconductor material of the substrate 24. The device design for such RFICs and the nature of the various FEOL processes are familiar to a person having ordinary skill in the art. The substrate 24 is typically a chip or die comprising a piece of a semiconductor wafer composed of a semiconductor material including, but not limited to, silicon (Si), silicon germanium (SiGe), a silicon-on-insulator (SOI) layer, and other like silicon-containing semiconductor materials. The active devices 22a, 22b are coupled by vias and wires in the M1 metallization level in the upper metallization levels or with each other.

The on-chip capacitor 16, which is structured as a vertical natural capacitor, includes conductive bars or tabs 26, 28 and electrodes 30, 32 constructed in the dielectric layer 12 of metallization level ($M_x$), as well conductive bars or tabs 34, 36 and electrodes 38, 40 fabricated in the dielectric layer 14 of metallization level ($M_{x-1}$). In one embodiment, the involved metallization levels ($M_x$) and ($M_{x-1}$) for the on-chip capacitor 16 are the M2 and M3 levels, or the M3 and M4 levels, of the BEOL wiring structure 10. Electrodes 30 are directly connected with conductive tab 26, electrodes 32 are directly connected with conductive tab 28, electrodes 38 are directly connected with conductive tab 34, and electrodes 40 are directly connected with conductive tab 36.

The conductive tabs 26, 28 and the conductive tabs 34, 36 have respective substantially parallel arrangements spaced by an amount sufficient to fit the electrodes 30, 32 or 38, 40 into the space separating them. Electrodes 30, 32 are disposed between conductive tabs 26, 28, and electrodes 38, 40 are disposed between conductive tabs 34, 36. In metallization level ($M_x$), electrodes 30 project laterally as spaced-apart, substantially parallel fingers or arms from conductive tab 26 toward conductive tab 28. Similarly, electrodes 32 project laterally as spaced-apart, substantially parallel fingers or arms from conductive tab 26 in a direction toward conductive tab 28. In metallization level ($M_{x-1}$), electrodes 38 project laterally as spaced-apart, substantially parallel fingers or arms from conductive tab 34 toward conductive tab 36 and, similarly, electrodes 40 project laterally as spaced-apart, substantially parallel fingers or arms from conductive tab 36 toward conductive tab 34.

Figure 2:
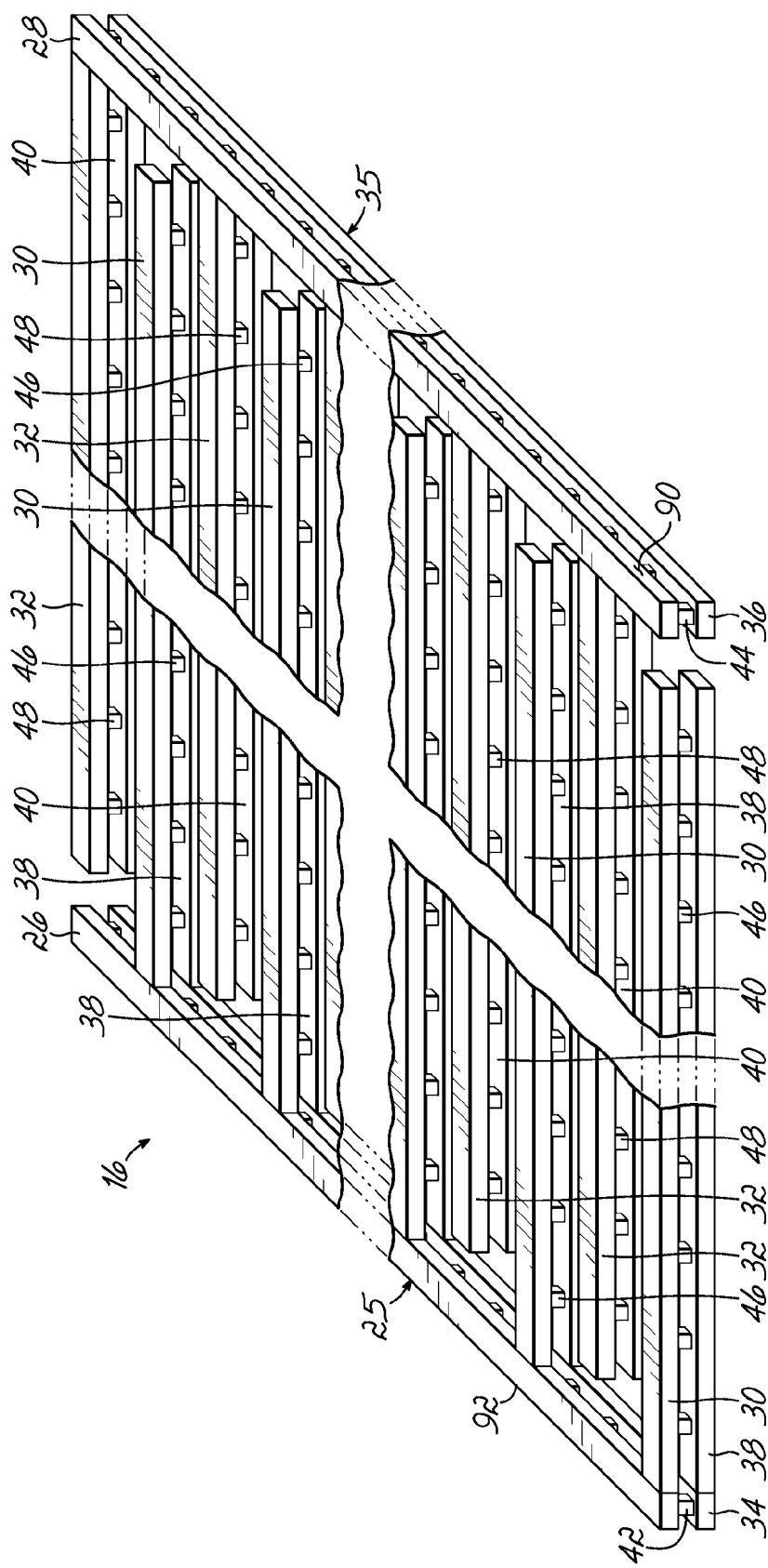
FIG. 2 is an enlarged view of corner portions of the on-chip capacitor of FIG. 1.

The electrodes 30, 32, 38, 40 are arranged in respective arrays of rows with one of the electrodes 30 stacked in near vertical alignment above one of the electrodes 38 and one of the electrodes 32 stacked in near vertical alignment above one of the electrodes 40, as best shown in FIG. 2. Specifically, the lateral sidewalls of the electrodes 30 are approximately aligned, when viewed in a vertical direction normal to the top surface 23 of the substrate 24, with the lateral sidewalls of the electrodes 38. Similarly, the lateral sidewalls of the electrodes 32 are approximately aligned, when viewed in a vertical direction normal to the top surface 23 of the substrate 24, with the lateral sidewalls of the electrodes 40.

Electrodes 30 and 32 have an interleaved arrangement relative to each other within the plane of the metallization level ($M_x$) to define an interleaved construction in which one of the electrodes 30 is disposed between each adjacent pair of electrodes 32 and, conversely, one of the electrodes 32 is disposed between each adjacent pair of electrodes 30. Electrodes 38 and 40 have a similar interleaved arrangement in which the electrodes 38, 40 alternate in a lateral direction within the plane of the metallization level ($M_{x-1}$). Slots or spaces between the electrodes 30, 32, 38, 40 and conductive tabs 26, 28, 34, 36 are filled with portions of the dielectric layers 12, 14, which supply electrical isolation.

Interconnect members, in the representative form of a row of spaced-apart vias 42 defined in the dielectric layer 14, extend vertically between conductive tab 26 and conductive tab 34 in the different metallization levels ($M_x$, $M_{x-1}$). Interconnect members, in the representative form of a row of spaced-apart vias 44 defined in the dielectric layer 14, extend vertically between conductive tab 28 and conductive tab 36 between the different metallization levels ($M_x$, $M_{x-1}$). Vias 42 electrically short conductive tabs 26, 34 together to define a port, which is generally indicated by reference numeral 25, of the on-chip capacitor 16. Vias 44 electrically short conductive tabs 28, 36 together to define another port, which is generally indicated by reference numeral 35, of the on-chip capacitor 16.

Interconnect members, in the representative form of a row of spaced-apart vias 46, extend vertically in dielectric layer 14 between the electrodes 30 in metallization level ($M_x$) and the electrodes 38 in metallization level ($M_{x-1}$). The electrodes 30 and 38 are electrically connected in parallel by the vias 46. Interconnect members, in the representative form of a row of spaced-apart vias 48, also extend vertically in dielectric layer 14 between the electrodes 32 in metallization level ($M_x$) and the electrodes 40 in metallization level ($M_{x-1}$). The electrodes 32 and 40 are electrically connected in parallel by the vias 46. As a result, the conductive tabs 26, 34 and each stack containing electrodes 30, 38 are interconnected in electrical continuity to effectively define one set of capacitor plates, and the conductive tabs 28, 36 and each stack containing electrodes 32, 40 are interconnected in electrical continuity to effectively define the opposite set of capacitor plates. Vias 42, 44, 46, 48 are contained in a common via level positioned between metallization level ($M_x$) and metallization level ($M_{x-1}$).

Port 25 of the on-chip capacitor 16 is connected to a power supply terminal of one polarity and port 35 of the on-chip capacitor 16 is connected to the power supply terminal of opposite polarity. As a result of this type of opposite polarity electrical connection and the interleaved arrangement described above, the electrodes 30, 38 and electrodes 32, 40 are electrically connected in an alternating manner to power supply terminals of opposite polarity, which generates a capacitance laterally between the electrodes 30, 32 and the electrodes 38, 40. The capacitance of the on-chip capacitor 16 has a fixed value, which is determined at least in part by the absolute number of electrodes. Each individual array of electrodes 30, 32, 38, 40 may each contain 10 to 50 electrodes, or an even greater number of electrodes. The capacitor dielectric for the on-chip capacitor 16 is supplied by portions of the dielectric layers 12, 14 used as interlayer dielectrics for the metallization levels ($M_x$, $M_{x-1}$).

The on-chip capacitor 16 forms a vertical natural capacitor structure as recognized by a person having ordinary skill in the art. The on-chip capacitor 16 may have one or more additional rows of interleaved electrodes (not shown) added either to a metallization level of the BEOL wiring structure 10 below metallization level ($M_{x-1}$) or to a metallization level of the BEOL wiring structure 10 between metallization level ($M_x$) and the on-chip inductor 20. Either construction is characterized by more than the two levels present in the representative embodiment. In one specific embodiment of the invention, the involved metallization levels of a three-level construction for the on-chip capacitor 16 may be the M2, M3, and M4 levels of in the BEOL wiring structure 10.

The on-chip inductor 20 includes a concentric array of signal lines 50, 52 that are disposed in the dielectric layers 18, 19 above dielectric layer 14 and bar vias 54 defined in dielectric layer 18 between the signal lines 50, 52. As illustrated, the signal lines 50, 52 have a octagonal geometry with plural concentric conductor turns; however, the invention is not so limited as the signal lines 50, 52 may also be formed in, for example, concentric hexagonal, rectangular, square, or circular geometrical shapes. The bar vias 54, which extend vertically in a via level of the BEOL wiring structure 10, electrically connect the signal lines 50 in metallization level ($M_{x+2}$) with the signal lines 52 in metallization level ($M_{x+1}$). In an alternative embodiment, the bar vias 54 may be replaced by vias (not shown) that are similar to vias 42, 44, 46, 48 associated with the on-chip capacitor 16.

The signal lines 50, 52, as well as the bar vias 54, are buried in and surrounded by portions of the dielectric layers 18, 19. Ports or terminals 56, 58, which are located at opposite ends of the signal lines 50, 52, are electrically coupled with the active devices 22a, 22b of the integrated circuit disposed on the substrate 24. Alternatively, the terminals 56, 58 may be electrically coupled with the ports 25, 35 of the on-chip capacitor 16 to form an LC resonator, as described below. The signal lines 50, 52 and bar vias 54 are conductive features in the upper metallization levels ($M_{x+1}$, $M_{x+2}$), such as the M4 and M5 levels or the M5 and M6 levels of the BEOL wiring structure 10. In the latter instance, additional intervening metallization levels may separate the on-chip inductor 20 from the on-chip capacitor 16.

Figure 2A:
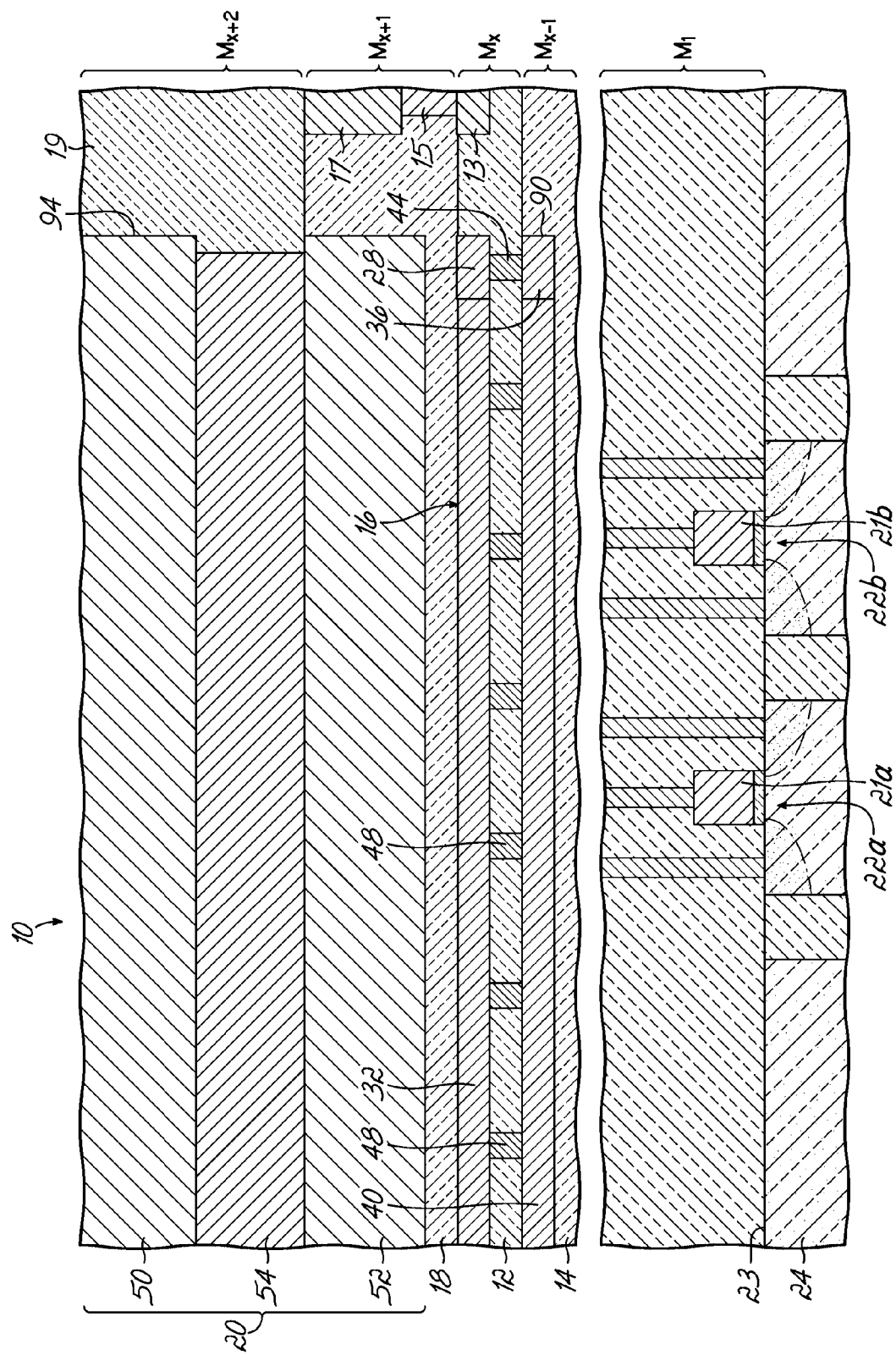
FIG. 2A is a cross-sectional view of a portion of FIG. 2 in which one port of the on-chip capacitor and the dielectric layers for the different metallization levels are visible, as well as the substrate and active devices underlying the BEOL wiring structure.

The on-chip capacitor 16 and the on-chip inductor 20 are arranged laterally within the respective metallization levels and in approximate vertical alignment such that the on-chip capacitor 16 is disposed between the on-chip inductor 20 and the substrate 24. Specifically, the outermost edges of the on-chip capacitor 16, such as representative edges 90, 92 respectively visible in FIGS. 2A and 2B, are approximately aligned, when viewed in a vertical direction, with the outermost edges of the on-chip inductor 20, such as representative edges 94, 96 respectively visible in FIGS. 2A and 2B. In the representative embodiment, the on-chip capacitor 16 effectively operates as a Faraday shield to enhance the inductor quality by increasing the quality factor, Q, of the on-chip inductor 20 and to provide isolation between the active devices 22a, 22b on substrate 24 and the on-chip inductor 20.

As mentioned above, the on-chip capacitor 16 and on-chip inductor 20 are formed by damascene processes conventionally associated with BEOL processing, which is used to form the conductive features in the various different stacked metallization levels of the BEOL wiring structure 10. Because of this commonality during manufacture, the conductive features of the on-chip capacitor 16 and on-chip inductor 20 are formed simultaneously with the other conductive features used to establish electrical connections with the active devices 22a, 22b on each associated metallization level (having the same material, thickness, etc).

Specifically, dielectric layer 14 is applied by a conventional deposition technique recognized by a person having ordinary skill in the art, and a pattern of via openings and trenches is defined in dielectric layer 14 using known lithography and etching techniques characteristic of a damascene process. To that end, a resist layer (not shown) is applied to the top surface of dielectric layer 14, exposed to radiation to impart a latent image of a trench pattern characteristic of tabs 34, 36 and electrodes 38, 40, and developed to transform the latent image of the trench pattern into a final image pattern with laterally dispersed surface areas of dielectric layer 14 unmasked at the future sites of tabs 34, 36 and electrodes 38, 40. Unmasked regions of dielectric layer 14 at these sites are removed with an etching process, such as reactive ion etching (RIE), capable of producing substantially vertical sidewalls for the trenches. The resulting trenches are filled using a conventional deposition process with amounts of a representative conductor to define the tabs 34, 36 and electrodes 38, 40 of metallization level ($M_{x-1}$). Any excess overburden of conductor remaining after the filling step is removed by planarization, such as with a chemical mechanical polishing (CMP) process.

Dielectric layer 12 is then applied by a conventional deposition process on dielectric layer 14. A resist layer (not shown) is applied to the top surface of dielectric layer 12, exposed to radiation to impart a latent image of a via opening pattern for vias 42, 44, 46, 48, and developed to transform the latent image of the via pattern into a final image pattern with laterally dispersed surface areas of dielectric layer 12 unmasked at the future sites of vias 42, 44, 46, 48. Unmasked regions of dielectric layer 12 at these future via sites are removed with an etching process, such as RIE, capable of producing substantially vertical sidewalls for the via openings which extend vertically to the top surfaces of the tabs 34, 36 and electrodes 38, 40.

Another resist layer (not shown) is applied to the top surface of dielectric layer 12, exposed to radiation to impart a latent image of a trench pattern for tabs 26, 28 and electrodes 30, 32, and developed to transform the latent image of the trench pattern into a final image pattern with laterally dispersed surface areas of dielectric layer 12 unmasked at the future sites of tabs 26, 28 and electrodes 30, 32. Unmasked regions of dielectric layer 12 at these sites are removed with an etching process, such as RIE, capable of producing substantially vertical sidewalls for the trenches. In a dual damascene process, the via openings and trenches in the dielectric layer 12 are filled with a representative conductor to define the tabs 26, 28, electrodes 30, 32, and vias 42, 44, 46, 48 of metallization level ($M_x$). Any excess overburden of conductor remaining after the filling step is removed by planarization, such as a CMP process.

The various resist layers used to form the on-chip capacitor 16 are the resist layers used to form the conventional BEOL metallization contained in metallization level ($M_{x-1}$) and metallization level ($M_x$). Consequently, the conductive features of the on-chip capacitor 16 represent portions of the BEOL metallization in these different metallization levels of the BEOL wiring structure 10.

Dielectric layer 18 is applied in direct contact with dielectric layer 12. A resist layer (not shown) is applied to the top surface of dielectric layer 18, exposed to radiation to impart a latent image of a trench pattern for signal lines 52 and developed to transform the latent image of the trench pattern into a final image pattern with laterally dispersed surface areas of dielectric layer 18 unmasked at the future sites of signal lines 52. An etching process, such as RIE, capable of producing substantially vertical trench sidewalls is applied to remove unmasked regions of the dielectric layer 18 at these future sites. The trenches are then filled with a representative conductor to define the signal lines 52. Any excess overburden of conductor remaining after the filling step is removed by planarization, such as a CMP process.

Dielectric layer 19 is applied in direct contact with dielectric layer 18. Another resist layer (not shown) is applied on dielectric layer 19, exposed to radiation to impart a latent image of a via opening pattern for bar vias 54 and developed to transform the latent image of the via pattern into a final image pattern with laterally dispersed surface areas of dielectric layer 19 unmasked at the future sites of the bar vias 54. Unmasked regions of the dielectric layer 19 at these sites are removed with an etching process, such as RIE, capable of producing substantially vertical sidewalls for the via openings, which extend vertically to the top surfaces of the signal lines 52.

Yet another resist layer (not shown) is applied to the top surface of dielectric layer 19, exposed to radiation to impart a latent image of a trench pattern for signal lines 50, and developed to transform the latent image of the trench pattern into a final image pattern with laterally dispersed surface areas of dielectric layer 19 unmasked at the future sites of signal lines 50. Unmasked regions of dielectric layer 19 at these sites are removed with an etching process, such as reactive ion etching (RIE), capable of producing substantially vertical sidewalls for the trenches. In a dual damascene process, the via openings and trenches in the dielectric layer 19 are filled with a representative conductor to define the signal lines 50 and bar vias 54. Any excess overburden of conductor remaining after the filling step is removed by planarization, such as a CMP process.

The various resist layers used to form the on-chip inductor 20 are the resist layers used to form the conventional BEOL metallization contained in the metallization levels ($M_{x+1}$, $M_{x+2}$). Consequently, the conductive features of the on-chip inductor 20 represent portions of the BEOL metallization in the metallization levels ($M_{x+1}$, $M_{x+2}$) of the BEOL wiring structure 10.

Dielectric layers 12, 14, 18, 19 may comprise any organic or inorganic dielectric material recognized by a person having ordinary skill in the art, which may be deposited by any number of well known conventional techniques such as sputtering, spin-on application, chemical vapor deposition (CVD) process or a plasma enhanced CVD (PECVD) process. Candidate inorganic dielectric materials for dielectric layers 12, 14, 18, 19 may include, but are not limited to, silicon dioxide, fluorine-doped silicon glass (FSG), and combinations of these dielectric materials. Alternatively, the dielectric material constituting dielectric layers 12, 14, 18, 19 may be characterized by a relative permittivity or dielectric constant smaller than the dielectric constant of silicon dioxide, which is about 3.9. Candidate low-k dielectric materials for dielectric layers 12, 14, 18, 19 include, but are not limited to, porous and nonporous spin-on organic low-k dielectrics, such as spin-on aromatic thermoset polymer resins, porous and nonporous inorganic low-k dielectrics, such as organosilicate glasses, hydrogen-enriched silicon oxycarbide (SiCOH), and carbon-doped oxides, and combinations of organic and inorganic dielectrics.

Candidate conductive materials for the on-chip capacitor 16 and on-chip inductor 20 include, but are not limited to, copper (Cu), aluminum (Al), alloys of these metals, other similar metals like tungsten (W), and metal silicides. These types of metals may be deposited by conventional deposition processes including, but not limited to a CVD process and an electrochemical process like electroplating or electroless plating as understood by a person having ordinary skill in the art. A thin conductive liner layer (not shown) may respectively clad one or more portions of the on-chip capacitor 16 and on-chip inductor 20 to isolate the conductor from the surrounding dielectric material and to optionally enhance adhesion between conductor and dielectric material. As examples, the thin conductive liner layer may comprise a bilayer of titanium and titanium nitride or a bilayer of tantalum or tantalum nitride applied to the dielectric material in each instance by conventional deposition processes.

In one embodiment, the on-chip capacitor 16 and on-chip inductor 20 may be coupled together in parallel to produce an LC tank or resonator for use in an RFIC. This is accomplished by providing conductive paths during BEOL processing in the metallization levels that establish connections between the on-chip capacitor 16 and the on-chip inductor 20. For example, the representative features 13, 15, 17 visible in FIG. 2A may be used to electrically connect one of the ports 25, 35 of on-chip capacitor 16 with one of the terminals 56, 58 of on-chip inductor 20. The LC resonator has a resonance frequency given mathematically by the reciprocal of the square root of the product of the inductance, L, of the on-chip inductor 20 and the capacitance, C, of the on-chip capacitor 16. Because the interconnected structure containing the on-chip capacitor 16 and on-chip inductor 20 oscillates at a well-defined frequency, it is possible to fabricate a voltage controlled oscillator (VCO).

Because of the vertically stacked arrangement for the on-chip capacitor 16 and on-chip inductor 20 in the BEOL wiring structure 10, the LC resonator is implemented with a relatively compact footprint, in comparison with conventional implementations, that makes more efficient use of the total surface area of the chip in contrast to the conventional use of completely separate chip areas for the fabrication of these passive devices.

Figure 3:
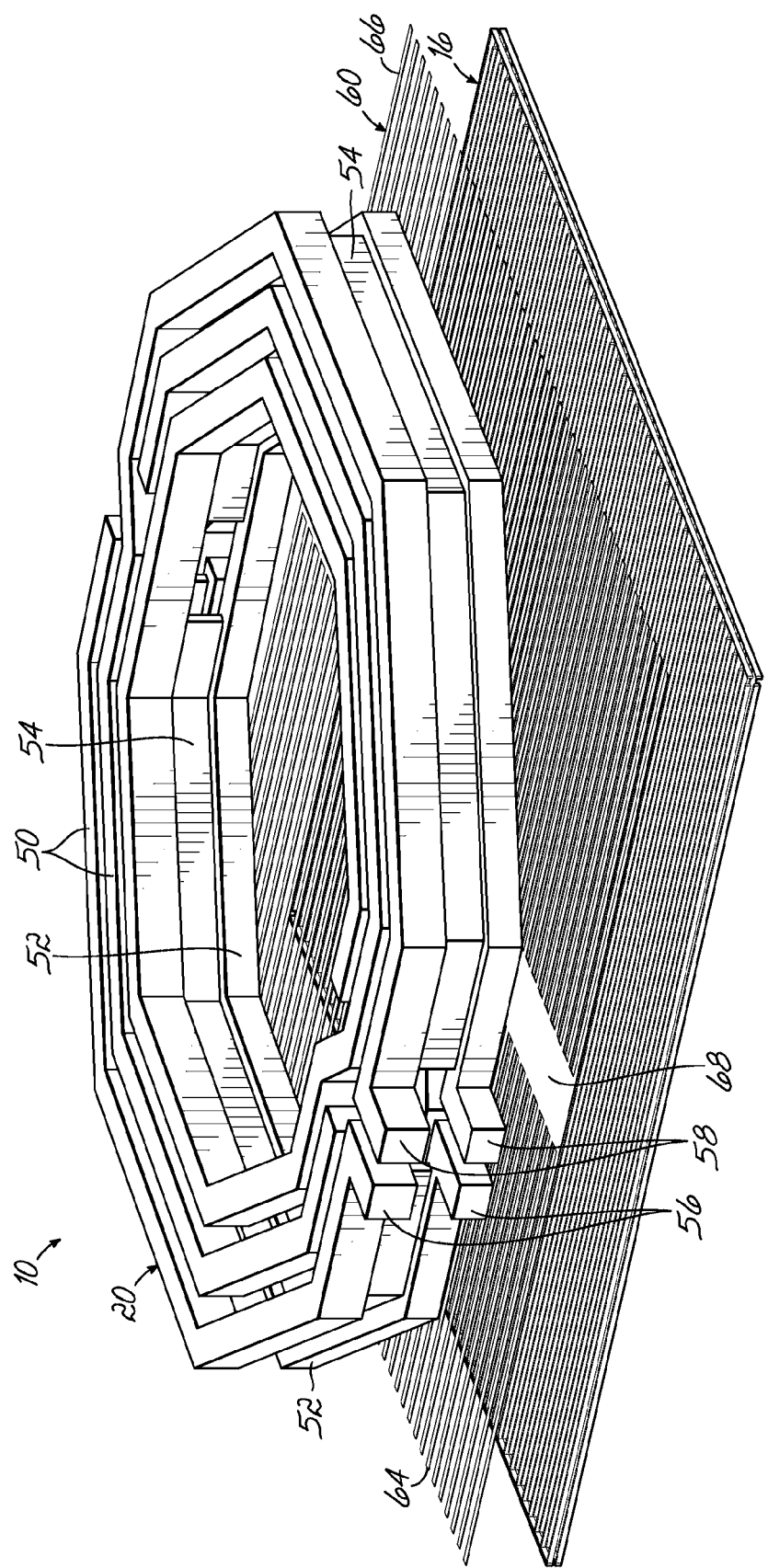
FIG. 3 is a perspective view similar to FIG. 1 of a BEOL wiring structure in which a Faraday shield is disposed between the on-chip inductor and on-chip capacitor in accordance with an alternative embodiment of the invention.

With reference to FIGS. 3 and 3A in which like reference numerals refer to like features in FIGS. 1, 2, 2A, 2B and in accordance with an alternative embodiment, the BEOL wiring structure 10 may be modified to incorporate a Faraday shield 60 deployed between the on-chip capacitor 16 and the on-chip inductor 20. The Faraday shield 60 is disposed in dielectric layer 62 of one or more metallization levels of the BEOL wiring structure 10 between the metallization levels ($M_x$, $M_{x-1}$) containing the on-chip capacitor 16 and the metallization levels ($M_{x+1}$, $M_{x+2}$) containing the on-chip inductor 20. For example, the involved metallization levels ($M_x$) and ($M_{x-1}$) may be the M2 and M3 levels for the on-chip capacitor 16, the M4 level for the Faraday shield 60, and the M5 and M6 levels for the on-chip inductor 20. The Faraday shield 60 constitutes a portion of the conductive features of the involved one or more metallization levels. The Faraday shield 60 is electrically isolated from the on-chip capacitor 16 and the on-chip inductor 20 by portions of at least the dielectric layers 12, 14, 18, and 62.

The Faraday shield 60, which is continuously tied to ground, includes a plurality of substantially identical parallel line segments or arms 64, 66 that extend orthogonally from opposite side edges of a central line 68. Each adjacent pair of arms 64, 66 is separated by a gap so that the Faraday shield 60 does not form a continuous ground plane or sheet. The Faraday shield 60 reduces capacitive coupling between the on-chip inductor 20 and the substrate 24, which operates to enhance the Q-factor of the on-chip inductor 20. The Faraday shield 60 also isolates the signal lines 50, 52 from the rest of the active devices 22a, 22b in the integrated circuit on substrate 24. Because of the presence of the Faraday shield 60, design constraints on the on-chip capacitor 16 can be relaxed as the on-chip capacitor 16 is not required to function as a Faraday shield.

The Faraday shield 60 is formed by the same or similar BEOL process techniques used to fabricate the on-chip capacitor 16 and the on-chip inductor 20, as well as other conductive features in the metallization levels, and from the same or similar BEOL metallurgies. The dielectric material constituting the dielectric layer 62 is similar in composition and properties to dielectric layers 12, 14, 18, 19. The conductor contained in the arms 64, 66 and central line 68 of the Faraday shield 60 is similar in composition and properties to the candidate conductive materials used to construct the on-chip capacitor 16 and on-chip inductor 20. The Faraday shield 60 is positioned laterally in the metallization level such that the Faraday shield 60 has the substantially vertical alignment with the on-chip capacitor 16 and the on-chip inductor 20.

Figure 4:
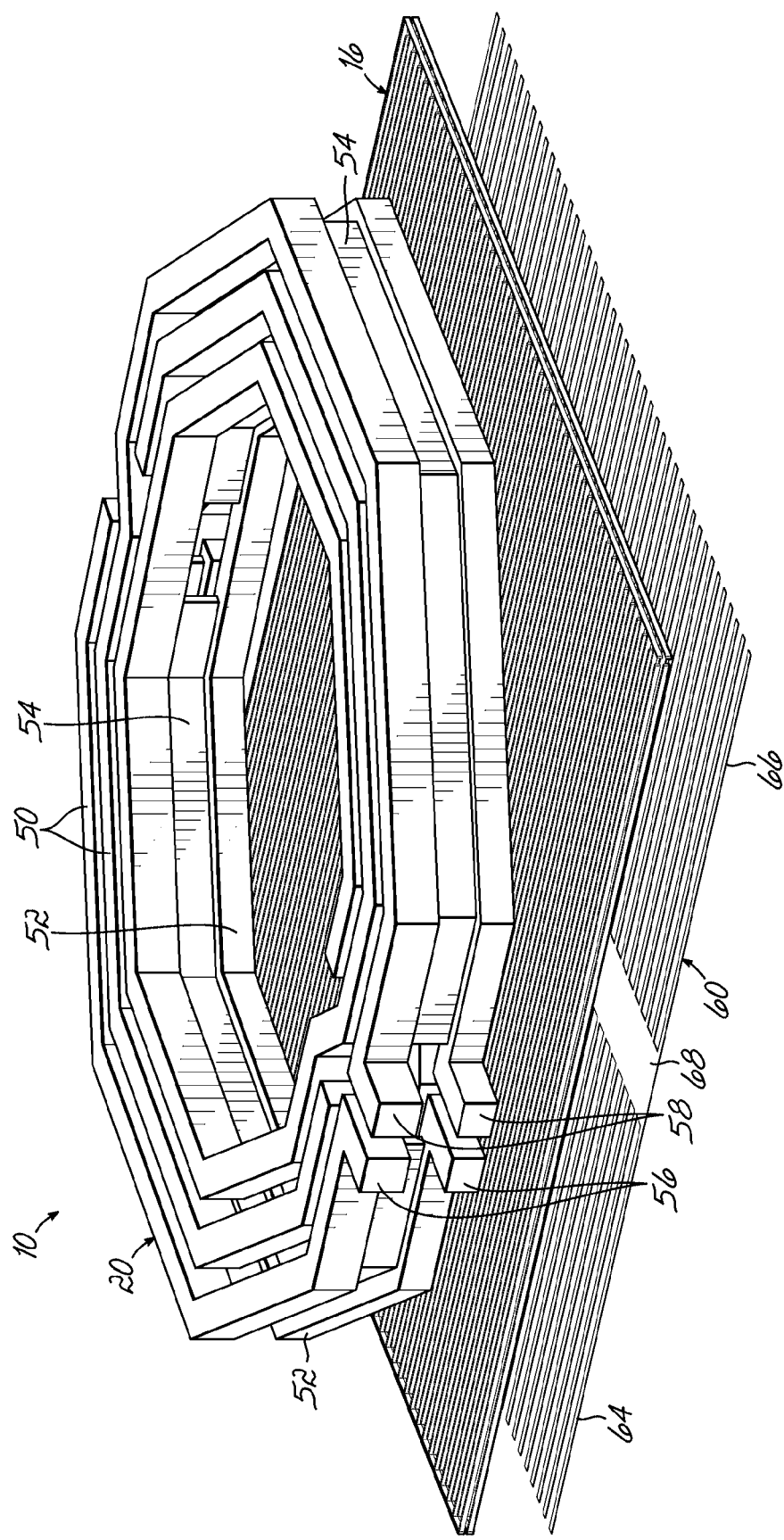
FIG. 4 is a perspective view similar to FIG. 3 of a BEOL wiring structure in which the Faraday shield is disposed between the on-chip capacitor and the active devices on the substrate in accordance with an alternative embodiment of the invention.
Figure 4A:
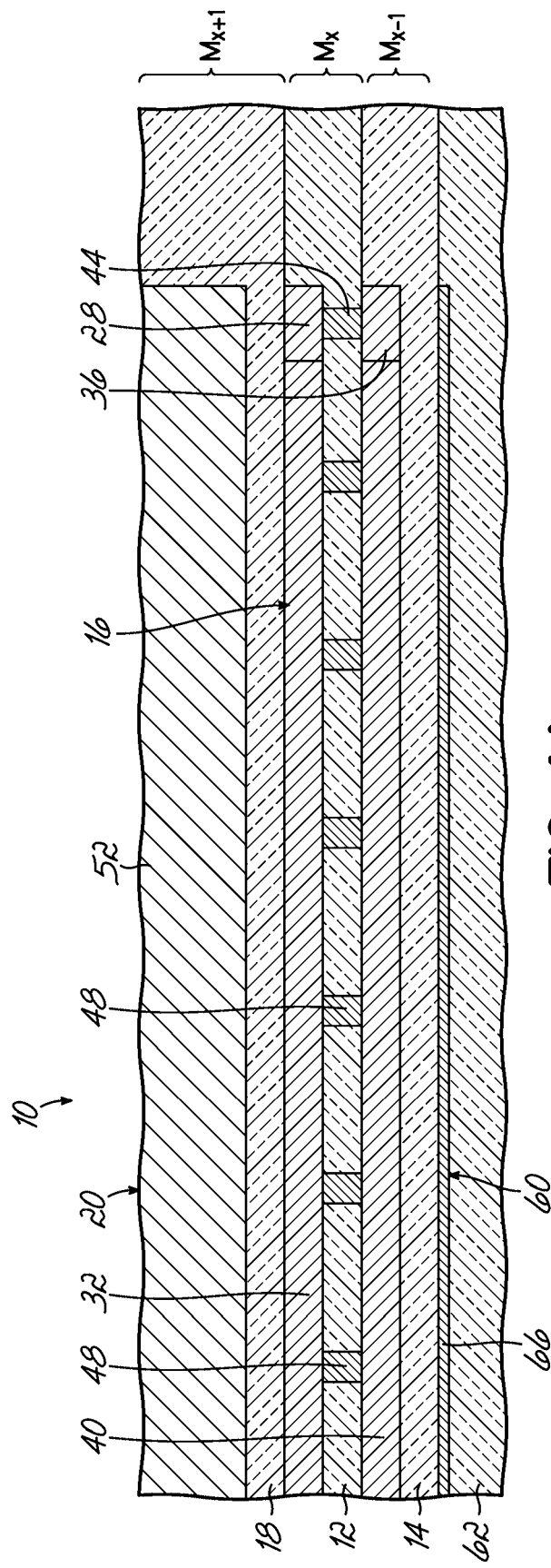
FIG. 4A is a cross-sectional view of the BEOL wiring structure of FIG. 4 in which one port of the on-chip capacitor and the dielectric layers for the different metallization levels are visible.

With reference to FIGS. 4 and 4A in which like reference numerals refer to like features in FIGS. 3, 3A and in accordance with an alternative embodiment, the stacked arrangement of the on-chip capacitor 16, on-chip inductor 20 and Faraday shield 60 of the BEOL wiring structure 10 may be modified such that the Faraday shield 60 is disposed vertically between the on-chip capacitor 16 and the substrate 24. Specifically, the Faraday shield 60 is disposed in a metallization level of the BEOL wiring structure 10 between the metallization level ($M_{x-1}$) containing the on-chip capacitor 16 and the substrate 24. For example, the involved metallization levels ($M_x$) and ($M_{x-1}$) may be the M2 and M3 levels for the on-chip capacitor 16, the M1 level for the Faraday shield 60, and the M5 and M6 levels for the on-chip inductor 20. In this embodiment, the on-chip capacitor 16 still operates as a Faraday shield for the on-chip inductor 20. The Faraday shield 60 is positioned laterally in the metallization level such that the Faraday shield 60 has the substantially vertical alignment with the on-chip capacitor 16 and the on-chip inductor 20.

Figure 5:
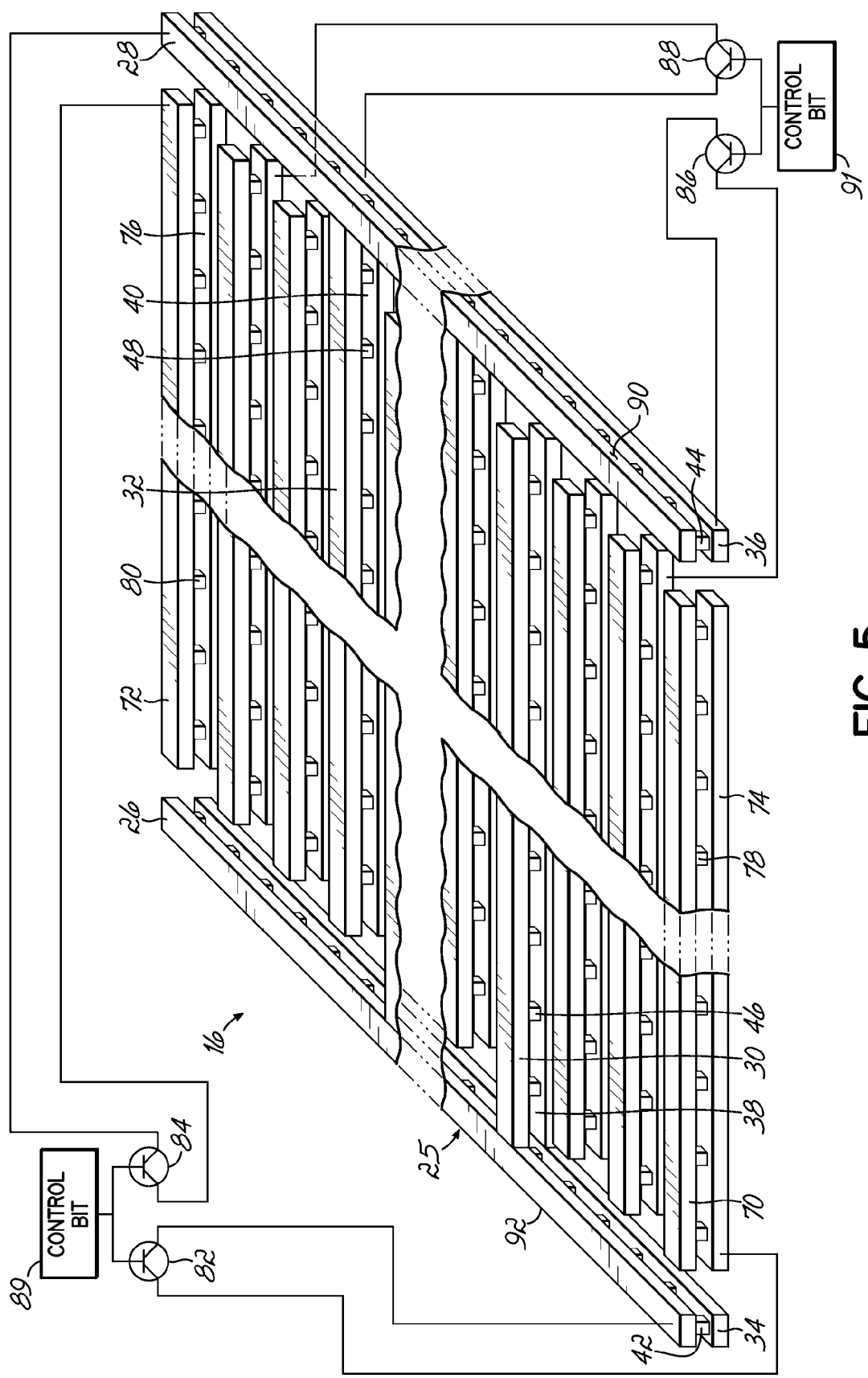
FIG. 5 is an enlarged view similar to FIG. 2 of a tunable on-chip capacitor for use in combination with the BEOL wiring structure in accordance with an alternative embodiment of the invention.

With reference to FIG. 5 in which like reference numerals refer to like features in FIG. 2 and in accordance with an alternative embodiment, the on-chip capacitor 16 may be modified such that the capacitance is no longer fixed, but instead has a passive device structure that is tunable to various different capacitance values. Specifically, the on-chip capacitor 16 may be modified to incorporate an array of electrodes 70, 72 located at one peripheral edge of the electrodes 30, 32, 38, 40 and an array of electrodes 74, 76 positioned at an opposite peripheral edge of the electrodes 30, 32, 38, 40. Electrodes 70 and 74 are contained within the dielectric layer 12 of metallization level ($M_x$), and electrodes 72 and 76 are contained within the dielectric layer 14 of metallization level ($M_{x-1}$). The tabs 26, 28, 34, 36 are extended in length, in comparison with the embodiment of FIG. 2, so that electrodes 70 and electrodes 74 are disposed between conductive tabs 26, 28, and electrodes 72 and electrodes 76 are disposed between conductive tabs 34, 36.

Each stacked pair of electrodes 70 and 74 are electrically connected by vertically-extending vias 78. Each stacked pair of electrodes 72 and 76 are electrically connected by vertically-extending vias 80. However, the electrodes 70, 72, 74, 76 are not electrically connected in a direct contact manner with the tabs 26, 28, 34, 36. Instead, switching devices in the representative form of transistors 82, 84, 86, 88, which are provided among the active devices 22a, 22b on the substrate 24, are used to selectively connect the electrodes 70, 72, 74, 76 in electrical continuity with the tabs 26, 28, 34, 36. The transistors 82, 84, 86, 88 are formed by conventional FEOL processes and with conventional device constructions that are understood by a person having ordinary skill in the art.

The transistors 82, 84, 86, 88 control whether a particular via-connected pair of the electrodes 70, 74 or a particular via-connected pair of the electrodes 72, 76 is connected to the on-chip capacitor 16 and whether its capacitance contributes to the total capacitance. Specifically, transistors 82 and 84 are concurrently switched by a control voltage or bit 89 to selectively connect one via-connected pair of electrodes 70, 72 with port 25 and one via-connected pair of electrodes 74, 76 with port 35. Similarly, transistors 86 and 88 are concurrently switched by a control voltage or bit 91 to selectively connect a different via-connected pair of electrodes 70, 72 with port 25 and a different via-connected pair of electrodes 74, 76 with port 35. Of course, the control bits 89, 91 can be simultaneously selected so that both pairs of electrodes 70, 72 and both pairs of electrodes 74, 76 are connected with the on-chip capacitor 16 to increase the capacitance. Additional electrodes (not shown) like electrodes 70, 72, 74, 76 and additional transistors (not shown) like transistors 82, 84, 86, 88 can be added to the device structure to increase the range of tunability of the capacitance of the on-chip capacitor 16.

Arranging the electrodes 70, 72, 74, 76 in a symmetrical matrix juxtaposed along the opposite peripheral edges of the electrodes 70, 72, 74, 76 of the on-chip capacitor 16 and switching the electrodes 70, 72, 74, 76 in symmetrical pairs about the mid-plane of the on-chip capacitor 16 eases the prediction of the total capacitance and parasitic capacitance for the on-chip capacitor 16. However, this embodiment is not so limited as the asymmetrical arrangement of control lines connecting the transistors 82, 84, 86, 88 with the electrodes 70, 72, 74, 76. Each of the via-connected pairs of electrodes 70, 72 and the via-connected pairs of electrodes 74, 76 adds approximately the same nominal discrete increment to the total capacitance of the on-chip capacitor 16. As a result, the on-chip capacitor 16 with the variable tuning capability introduced by the addition of the electrodes 70, 72, 74, 76 can be used to adjust the resonance frequency output by an LC resonator commonly found in an RFIC.

Figure 6:
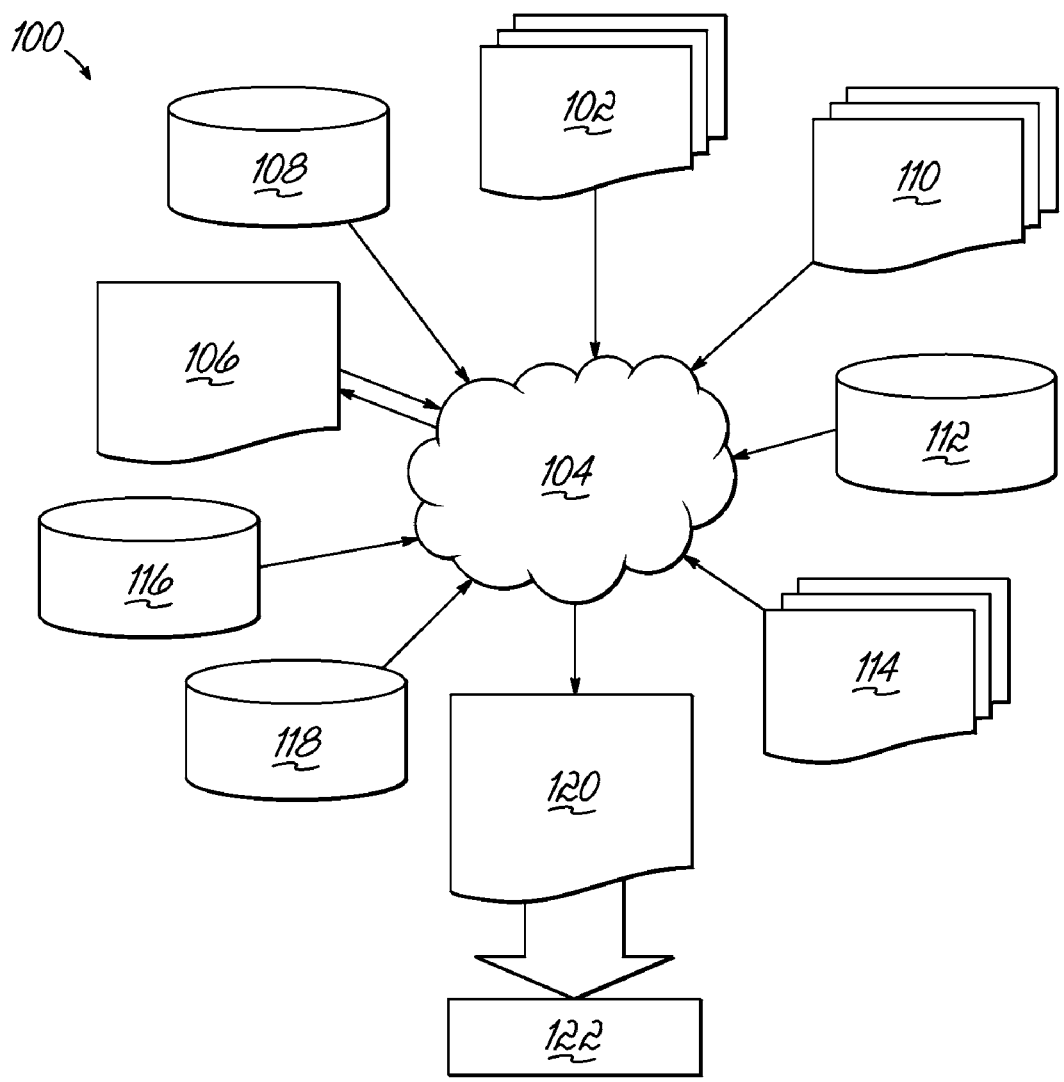
FIG. 6 is a flow diagram of a design process used in semiconductor design, manufacture, and/or test.

FIG. 6 shows a block diagram of an exemplary design flow 100 used for example, in semiconductor IC logic design, simulation, test, layout, and manufacture. Design flow 100 includes processes and mechanisms for processing design structures or devices to generate logically or otherwise functionally equivalent representations of the design structures and/or devices described above and shown in FIGS. 1-5. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 1-5. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 1-5 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 120 may comprise a compiled, executable HDL simulation model that functionally simulates the devices shown in FIGS. 1-5.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 120 may then proceed to a stage 122 where, for example, design structure 120: proceeds to tape-out, is released to manufacturing, is released to a mask house, is sent to another design house, is sent back to the customer, etc.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

It will be understood that when an element as a layer, region or substrate is described as being "on" or "over" another element, it can be directly on or over the other element or intervening elements may also be present. In contrast, when an element is described as being "directly on" or "directly over" another element, there are no intervening elements present. It will also be understood that when an element is described as being "connected" or "coupled" to another element, it can be directly connected or coupled to the other element or intervening elements may be present. In contrast, when an element is described as being "directly connected" or "directly coupled" to another element, there are no intervening elements present.

As used herein, the terms "vertical alignment" and "vertically aligned" do not require precise vertical alignment of all edges of vertically aligned objects as some spatial offsets and tolerances are allowed. Objects contained in the BEOL wiring structure 10 can be slightly offset, when viewed from a vertical perspective normal to the top surface 23 of the substrate 24, and retain the substantially vertical alignment. However, at least partial overlap is maintained.

The fabrication of the semiconductor structure herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method for fabricating a back-end-of-line (BEOL) wiring structure on a substrate carrying an integrated circuit, the BEOL wiring structure including at least one first metallization level and at least one second metallization level vertically disposed between the at least one first metallization level and the substrate, comprising:

forming a plurality of first conductive features in the at least one first metallization level that include an on-chip inductor; and forming a plurality of second conductive features in the at least one second metallization level that include an on-chip capacitor positioned laterally in the at least one second metallization level such that the on-chip capacitor is in substantially vertical alignment with the on-chip inductor in the at least one first metallization level.

2. The method of claim 1 wherein a portion of the first conductive features in the at least one first metallization level and a portion of the second conductive features in the at least one second metallization level operate to electrically connect the on-chip inductor with the on-chip capacitor.

3. The method of claim 2 wherein the second conductive features forming the on-chip capacitor include first and second ports, a plurality of first electrodes directly connected to the first port, and a plurality of second electrodes directly connected to the second port, the first and second electrodes interleaved with each other, and further comprising:

forming at least one floating electrode in the at least one second metallization level that is electrically isolated from the first and second ports and from the first and second electrodes; and forming a switching device configured to connect the at least one floating electrode indirectly with either the first port or the second port.

4. The method of claim 1 further comprising:

forming a plurality of third conductive features in a third metallization level between the at least one first metallization level and the at least one second metallization level and including a Faraday shield positioned laterally in the third metallization level such that the Faraday shield has the substantially vertical alignment with the on-chip inductor and the on-chip capacitor.

5. The method of claim 1 further comprising:
forming a plurality of third conductive features in a third metallization level between the substrate and the at least one second metallization level and including a Faraday shield positioned laterally within the third metallization level such that the Faraday shield has the substantially vertical alignment with the on-chip inductor and the on-chip capacitor.

6. The method of claim 1 wherein the second conductive features of the on-chip capacitor are configured structurally to operate as a Faraday shield for the on-chip inductor, and further comprising:
a third metallization level between the at least one first metallization level and the substrate, the third metallization layer being free of a Faraday shield positioned laterally within the third metallization level in the substantially vertical alignment with the on-chip inductor and the on-chip-inductor.

7. The method of claim 1 further comprising:
forming at least one floating conductive feature in the at least one first metallization level that is electrically isolated from the on-chip capacitor; and
forming a switching device configured to connect the at least one floating conductive feature indirectly with the on-chip capacitor.

8. The method of claim 1 wherein the first conductive features in the at least one first metallization level and the second conductive features in the at least one second metallization level are connected with one or more active devices of the integrated circuit.

9. The method of claim 8 wherein the first conductive features connected with the one or more active devices and the first conductive features defining the on-chip inductor are concurrently fabricated in a dielectric layer of the at least one first metallization level.

10. The method of claim 9 wherein the second conductive features connected with the one or more active devices and the second conductive features defining the on-chip capacitor are concurrently fabricated in a dielectric layer of the at least one second metallization level.

11. The method of claim 10 wherein the first conductive features are formed by a first damascene process, and the second conductive features are formed by a second damascene process.

12. The method of claim 9 wherein the second conductive features connected with the one or more active devices and the second conductive features defining the on-chip capacitor are concurrently fabricated in a dielectric layer of the at least one second metallization level.

13. The method of claim 1 wherein the on-chip inductor includes a plurality of signal lines that are distributed among stacked first and second dielectric layers, and forming the first conductive features further comprises:
forming a portion of the signal lines in the first dielectric layer;
forming another portion of the signal lines in the second dielectric layer; and
forming vias that connect the signal lines in the first dielectric layer with the signal lines in the second dielectric layer.

14. The method of claim 1 wherein the on-chip capacitor includes a plurality of electrodes that are distributed among stacked first and second dielectric layers, and forming the second conductive features further comprises:
forming a portion of the electrodes in the first dielectric layer;
forming another portion of the electrodes in the second dielectric layer; and
forming vias that connect the electrodes in the first dielectric layer with the electrodes in the second dielectric layer.

15. A method for fabricating of a back-end-of-line (BEOL) wiring structure including an LC resonator with a resonance frequency that is tunable during operation of the LC resonator, comprising:
forming a plurality of signal lines of an on-chip inductor in at least one first metallization level of the BEOL wiring structure;
forming a plurality of electrodes for an on-chip capacitor in at least one second metallization level of the BEOL wiring structure;
forming a plurality of conductive features in the at least one first metallization level and the at least one second metallization level that connect the signal lines of the on-chip inductor with the plurality of electrodes of the on-chip capacitor to define the LC resonator;
forming at least one floating electrode in the at least one second metallization level that is electrically insulated from the plurality of electrodes of the on-chip capacitor; and
forming a switching device configured to connect the at least one floating electrode indirectly with the plurality of electrodes of the on-chip capacitor to permit tuning of the resonance frequency of the LC resonator during operation of the LC resonator.

16. The method of claim 15 wherein the on-chip capacitor is positioned laterally in the at least second metallization level such that the on-chip capacitor and the on-chip inductor are in substantially vertical alignment.

17. The method of claim 16 further comprising:
forming a third metallization level between the at least one first metallization level and the at least one second metallization level that includes a Faraday shield positioned laterally within the third metallization level in the substantially vertical alignment with the on-chip inductor and the on-chip capacitor.

18. The method of claim 16 further comprising:
forming a third metallization level between a substrate carrying the integrated circuit and the at least one second metallization level that includes a Faraday shield positioned laterally within the third metallization level in the substantially vertical alignment with the on-chip inductor and the on-chip capacitor.

19. The method of claim 16 wherein the second conductive features of the on-chip capacitor are configured structurally to operate as a Faraday shield for the on-chip inductor, and further comprising:
a third metallization level between the at least one first metallization level and the substrate, the third metallization layer being free of a Faraday shield positioned laterally within the third metallization level in the substantially vertical alignment with the on-chip inductor and the on-chip-inductor.

20. The method of claim 15 wherein the signal lines and the conductive features in the at least one first metallization level are formed by a first damascene process, and the electrodes and the conductive features in the at least one second metallization level are formed by a second damascene process.

21. The method of claim 15 wherein the LC resonator is include in a radiofrequency integrated circuit (RFIC) carried on the substrate.

22. A method of tuning a resonance frequency of an LC resonator that includes a plurality of signal lines for an on-chip inductor and a plurality of electrodes for an on-chip capacitor in different metallization levels of a back-end-of-line (BEOL) wiring structure, comprising:

while the LC resonator is operating, selectively coupling at least one floating electrode in at least one of the different metallization levels with the plurality of electrodes of the on-chip capacitor to tune the resonance frequency of the LC resonator by changing a capacitance of the on-chip capacitor.

23. The method of claim 22 wherein the on-chip capacitor is positioned laterally in at least one of the different metallization levels such that the on-chip capacitor is in a substantially vertical alignment with the on-chip inductor.

24. The method of claim 22 wherein selectively coupling the at least one floating electrode in at least one of the different metallization levels with the electrodes of the on-chip capacitor further comprises:

selectively connecting a plurality of floating electrodes with the electrodes that are symmetrically juxtaposed spatially relative to the electrodes.

25. The method of claim 22 wherein selectively coupling the at least one floating electrode in at least one of the different metallization levels with the electrodes of the on-chip capacitor further comprises:

switching a transistor of an integrated circuit on a chip carrying the BEOL wiring structure to connect the at least one floating electrode indirectly with the electrodes of the on-chip capacitor.

* * * * *